US012721021B2

(12) United States Patent
Yin et al.

(10) Patent No.: US 12,721,021 B2
(45) Date of Patent: Aug. 25, 2026

(54) DISPLAY PANEL AND DISPLAY DEVICE

(71) Applicant: Shenzhen China Star Optoelectronics Semiconductor Display Technology Co., Ltd., Shenzhen (CN)

(72) Inventors: Zhiyuan Yin, Shenzhen (CN); Weiran Cao, Shenzhen (CN); Ting Shi, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 536 days.

(21) Appl. No.: 18/194,398

(22) Filed: Mar. 31, 2023

(65) Prior Publication Data

US 2024/0260434 A1 Aug. 1, 2024

(30) Foreign Application Priority Data

Jan. 31, 2023 (CN) ......................... 202310093155.3

(51) Int. Cl.
*H10K 59/80* (2023.01)

(52) U.S. Cl.
CPC ....... *H10K 59/8793* (2023.02); *H10K 59/873* (2023.02)

(58) Field of Classification Search
CPC ... H10K 59/873; H10K 59/8793; H10K 50/86
See application file for complete search history.

(56) References Cited

U.S. PATENT DOCUMENTS

2005/0030447 A1* 2/2005 Hsu ..................... G02F 1/13363 349/102
2017/0285399 A1* 10/2017 Nakamura ........ G02F 1/133528
2023/0157058 A1* 5/2023 Mundoor ............... H10K 50/85 257/40

* cited by examiner

*Primary Examiner* — Vongsavanh Sengdara
(74) *Attorney, Agent, or Firm* — PV IP PC; Christopher S. Ruprecht; Wei Te Chung

(57) ABSTRACT

Embodiments of the present disclosure are directed to a display panel and a display device. The display panel includes a light-emitting functional layer disposed on a substrate, a dimming metal array layer disposed on a side of the light-emitting functional layer away from the substrate, and a circular polarizer. The circular polarizer includes a linear polarizing layer and a quarter-wave plate disposed on a side of the dimming metal array layer away from the light-emitting functional layer. The dimming metal array layer is configured to convert light into elliptically polarized light. A included angle between an elliptical long axis direction of the elliptically polarized light and a light transmission axis direction of the linear polarizing layer is less than or equal to 45 degrees.

16 Claims, 4 Drawing Sheets

DISPLAY PANEL AND DISPLAY DEVICE

FIELD OF INVENTION

The present invention relates to a field of display technology, in particular, to a display panel and a display device.

DESCRIPTION OF PRIOR ART

In recent years, due to characteristics of organic light-emitting diode (OLED) displays, such as self-illumination, wide viewing angle, short response time, high luminous efficiency, wide color gamut, low operating voltage, thin thickness, large-size and flexible display, and simple manufacturing process, and the potential of low cost, the OLED displays have become a very popular emerging flat-panel display product at home and abroad.

At present, please refer to FIG. 1. In related art, an OLED display panel includes an anode layer 1, an organic light-emitting layer 2, a cathode layer 3, and a circular polarizer 6 that are stacked, and the circular polarizer 6 includes a quarter-wave plate 4 and a linear polarizing layer 5. The circular polarizer 6 is disposed in the OLED display panel to reduce reflectivity and improve display effect of the OLED display panel. Specifically, when ambient light a is irradiated into the OLED display panel, the light a passes through the linear polarizing layer 5 and is converted into light b whose polarization direction is parallel to a light transmission axis direction of the linear polarizing layer 5. The light b passes through the quarter-wave plate 4 and is converted into circularly polarized light c, and the circularly polarized light c reaches the quarter-wave plate 4 again after being reflected by the anode layer 1. The circularly polarized light c passes through the quarter-wave plate 4 again, and will be converted into linear polarized light d. A polarization direction of the linear polarized light d is deflected by 90 degrees relative to a polarization direction of the light b, that is, perpendicular to the light transmission axis direction of the linear polarizing layer 5, so that the linear polarized light d cannot pass through the linear polarizing layer 5. Furthermore, the reflectivity of the OLED display panel can be effectively reduced. However, for a self-illumination process of the OLED display panel, the organic light-emitting layer 2 emits light rays e and f, and when the light rays e and f pass through the linear polarizing layer 5, only the light whose polarization direction is parallel to the light transmission axis of the linear polarizing layer 5 can pass through, while other light will be blocked. Therefore, light extraction efficiency of the OLED display panel is greatly reduced, thus increasing power consumption of the OLED display panel.

SUMMARY

Embodiments of the present invention provide a display panel and a display device, which can improve light extraction efficiency of the display panel and reduce power consumption of the display panel.

The embodiments of the present invention provide a display panel, which including:

- a substrate;
- a light-emitting functional layer, disposed on the substrate;
- a dimming metal array layer, disposed on a side of the light-emitting functional layer away from the substrate, and configured to convert light into elliptically polarized light; and
- a circular polarizer, comprising a linear polarizing layer and a quarter-wave plate disposed on a side of the dimming metal array layer away from the light-emitting functional layer,
- wherein an included angle between an elliptical long axis direction of the elliptically polarized light and a light transmission axis direction of the linear polarizing layer is less than or equal to 45 degrees.

In one embodiment of the present invention, the dimming metal array layer includes a plurality of nano-metal units arranged at intervals.

In one embodiment of the present invention, a distance between adjacent two of the nano-metal units is ranged between 200 nm and 300 nm; and

- an area of an orthographic projection of each of the nano-metal units on the substrate is ranged between 225 square nanometers and 10000 square nanometers.

In one embodiment of the present invention, a shape of the orthographic projection of each of the nano-metal units on the substrate includes a convex polygon or a concave polygon, and a material of the dimming metal array layer includes gold or silver.

In one embodiment of the present invention, the display panel further includes an encapsulation layer disposed between the light-emitting functional layer and the linear polarizing layer, the encapsulation layer includes a plurality of encapsulation sub-layers arranged in layers, and the dimming metal array layer is disposed between any adjacent two of the encapsulation sub-layers.

In one embodiment of the present invention, the light-emitting functional layer comprises a light-emitting layer and a cathode layer located on a side of the light-emitting layer away from the substrate; the plurality of encapsulation sub-layers comprise a first encapsulation sub-layer disposed on a side of the cathode layer away from the light-emitting layer and a second encapsulation sub-layer disposed on a side of the first encapsulation sub-layer away from the cathode layer; the dimming metal array layer is disposed on the side of the first encapsulation sub-layer away from the cathode layer; and the second encapsulation sub-layer covers the dimming metal array layer.

In one embodiment of the present invention, a light vector component in a polarization direction of the elliptically polarized light along the light transmission axis of the linear polarizing layer is greater than or equal to 60%.

In one embodiment of the present invention, the included angle between the elliptical long axis direction of the elliptically polarized light and the light transmission axis direction of the linear polarizing layer is less than or equal to 25 degrees.

In one embodiment of the present invention, the display panel includes a display area that comprises a middle display area and a peripheral display area disposed around the middle display area where the dimming metal array layer is disposed.

According to the above purpose of the present invention, the embodiments of the present invention further provides a display device, and the display device includes the display panel defined above.

Beneficial effects of the present invention: in the present invention, the dimming metal array layer is added between the light-emitting functional layer and the linear polarizing layer to convert the passing light into elliptically polarized light. The included angle between the elliptical long axis direction of the elliptically polarized light and the light transmission axis direction of the linear polarizing layer is less than or equal to 45 degrees. Compared with the circularly polarized light in the prior art, the present invention can increase the light vector of the light reaching the linear polarizing layer along the light transmission axis direction of the linear polarizing layer. Therefore, more light can pass through the linear polarizing layer, which improves the light extraction intensity and light extraction efficiency of the display panel, thereby reducing the power consumption of the display panel.

BRIEF DESCRIPTION OF DRAWINGS

The technical solutions and other beneficial effects of the present invention will be apparent through the detailed description of specific embodiments of the present invention in conjunction with the accompanying drawings.

DETAILED DESCRIPTION OF EMBODIMENTS

Figure 1:
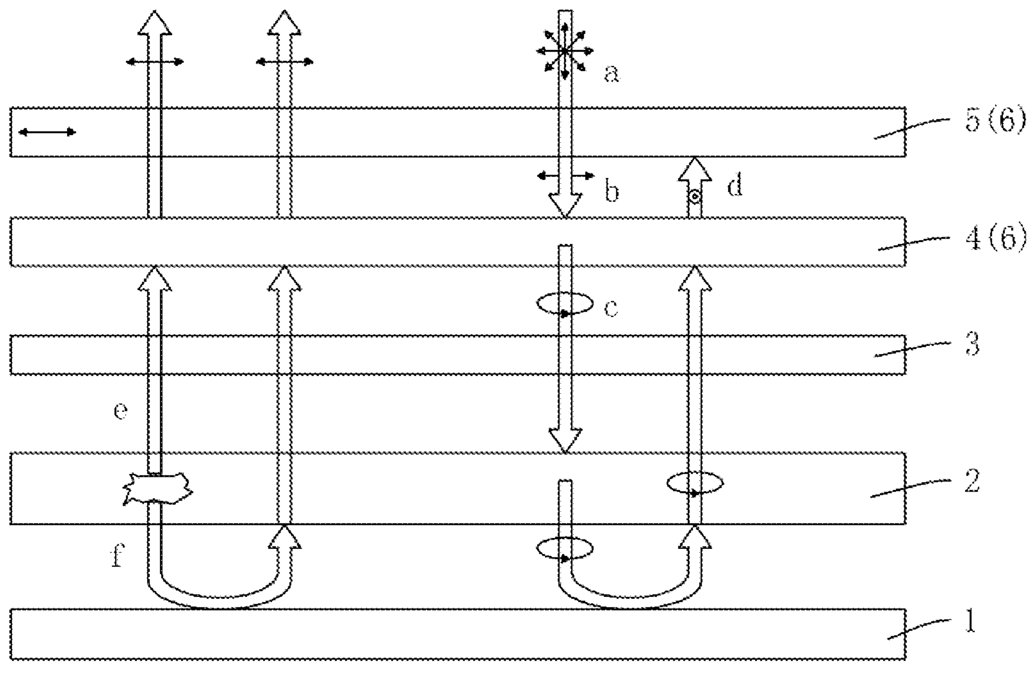
FIG. 1 is a schematic diagram of an optical path of a display panel in related art.

In the following, the technical scheme in the embodiments of the present invention will be described clearly and completely in combination with the drawings. Obviously, the described embodiments are only a part of the embodiments of the present invention, rather than all the embodiments. Based on the embodiments of the present invention, all other embodiments obtained by those skilled in the art without creative work fall within the protection scope of the present invention.

The following invention provides many different embodiments or examples for implementing different structures of the present invention. To simplify the present invention of the present invention, components and arrangements of specific examples are described below. Of course, they are only examples and are not intended to limit the present invention. Furthermore, reference numerals and/or reference letters may be repeated in different examples in the present invention. This repeating is for the purpose of simplification and clarity and does not refer to relations between different embodiments and/or settings. Furthermore, examples of different processes and materials are provided in the present invention. However, it would be appreciated by those skilled in the art that other processes and/or materials may be also applied.

Figure 2:
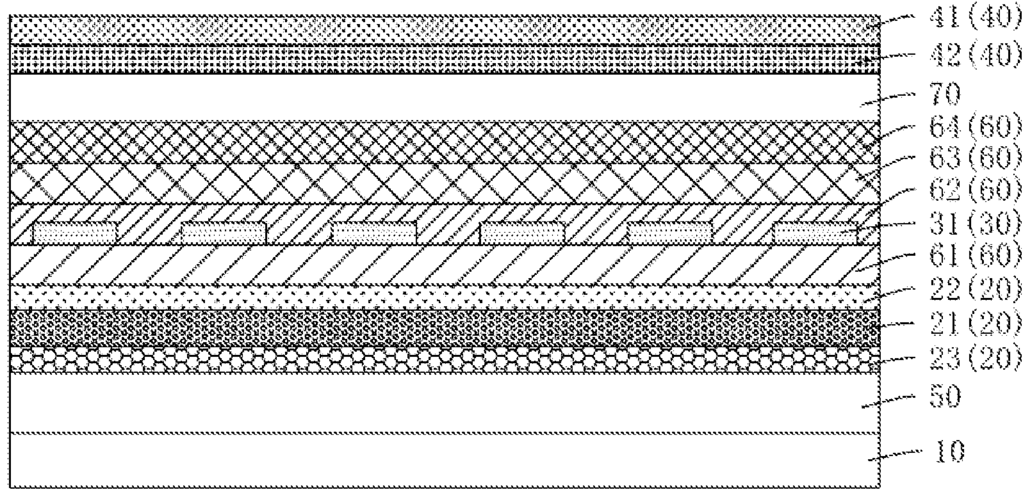
FIG. 2 is a schematic structural diagram of a display panel provided by embodiments of the present invention.

Referring to FIG. 2, the embodiment of the present invention provides a display panel which includes a substrate 10, a light-emitting functional layer 20, a dimming metal array layer 30, and a circular polarizer 40. The light-emitting functional layer 20 is disposed on the substrate 10. The dimming metal array layer 30 is disposed on a side of the light-emitting functional layer 20 away from the substrate 10. The circular polarizer 40 includes a linear polarizing layer 41 and a quarter-wave plate 42 disposed on a side of the dimming metal array layer 30 away from the light-emitting functional layer 20.

Further, the dimming metal array layer 30 is configured to convert light passing through the dimming metal array layer 30 into elliptically polarized light. An included angle between an elliptical long axis direction of the elliptically polarized light and a light transmission axis direction of the linear polarizing layer is less than or equal to 45 degrees.

During implementation and application, the embodiment of the present invention utilizes the dimming metal array layer 30 between the light-emitting functional layer 20 and the linear polarizing layer 41 to convert the passing light into the elliptically polarized light. The included angle between the elliptical long axis direction of the elliptically polarized light and the light transmission axis direction of the linear polarizing layer 41 is less than or equal to 45 degrees. Compared with the circularly polarized light in the prior art, the embodiments of the present invention can increase the light vector of the light reaching the linear polarizing layer 41 along the light transmission axis direction of the linear polarizing layer 41. Therefore, more light can pass through the linear polarizing layer 41, which improves the light extraction intensity and light extraction efficiency of the display panel, thereby reducing the power consumption of the display panel.

Please refer to FIG. 2, the display panel further includes a substrate 10, a driving circuit layer 50 disposed on the substrate 10, an encapsulation layer 60 disposed on the light-emitting functional layer 20, and a cover plate 70 disposed on the encapsulation layer 60. The circular polarizer 40 is disposed on the cover plate 70. The linear polarizing layer 41 and the quarter-wave plate 42 are also disposed on the cover plate 70.

The driving circuit layer 50 includes a plurality of thin-film transistors and signal lines disposed on the substrate 10 and a plurality of insulating layers covering the thin-film transistors and the signal lines. The light-emitting functional layer 20 includes an anode layer 23, a light-emitting layer 21, and a cathode layer 22 sequentially disposed on the driving circuit layer 50. By applying voltages to the anode layer 23 and the cathode layer 22, electrons and holes are recombined in the light-emitting layer 21 to excite light, so as to realize light emission from the light-emitting functional layer 20.

The encapsulation layer 60 covers a side of the cathode layer 22 away from the light-emitting layer 21. The encapsulation layer 60 may include a plurality of stacked encapsulation sub-layers, and a material of each of the encapsulation sub-layers may include inorganic materials or organic materials. Specifically, the encapsulation layer 60 may include a first encapsulation sub-layer 61, a second encapsulation sub-layer 62, a third encapsulation sub-layer 63, and a fourth encapsulation sub-layer 64 which are sequentially stacked on the side of the cathode layer 22 away from the light-emitting layer 21.

The circular polarizer 40 is disposed on a side of the cover plate 70 away from the encapsulation layer 60. The linear polarizing layer 41 and the quarter-wave plate 42 are both disposed on the side of the cover plate 70 away from the encapsulation layer 60. In one embodiment, the quarter-wave plate 42 is located between the linear polarizing layer 41 and the cover plate 70.

As mentioned above, the circular polarizer 40 can reduce the reflectivity, so as to improve the display effect of the display panel. In addition, in the embodiments of the present invention, the dimming metal array layer 30 is added between the light-emitting functional layer 20 and the linear polarizing layer 41 to convert the light passing through the dimming metal array layer 30 into the elliptically polarized light. The included angle between the elliptical long axis direction of the elliptically polarized light and the light transmission axis direction of the linear polarizing layer 41 is less than or equal to 45 degrees.

It should be noted that in the elliptically polarized light, an amplitude of a light vector along a long axis direction of the ellipse is greater than an amplitude of a light vector along a short axis direction of the ellipse, and light intensity is proportional to the square of the light amplitude. At a same time, the greater the light intensity, the more photons. Therefore, in the embodiments of the present invention, the included angle between the elliptical long axis direction of the elliptically polarized light and the light transmission axis direction of the linear polarizing layer 41 is less than or equal to 45 degrees, and compared with the circularly polarized light in related technologies, the light intensity and photon number of the light vector along the light transmission axis direction of the linear polarizing layer 41 in the elliptically polarized light can be increased. Therefore, more light can pass through the linear polarizing layer 41, which improves the light extraction intensity and light extraction efficiency of the display panel. Furthermore, when the display panel needs to reach a same brightness, the embodiments of the present invention can reduce the power consumption of the display panel.

In the embodiments of the present invention, a light vector component of the elliptically polarized light along the light transmission axis direction of the linear polarizing layer is greater than or equal to 60%, so as to effectively improve the light extraction efficiency of the display panel. Further, the included angle between elliptical long axis direction of the elliptically polarized light and the light transmission axis direction of the linear polarizing layer 41 is less than or equal to 25 degrees.

Specifically, the dimming metal array layer 30 may be disposed in the encapsulation layer 60, that is, the dimming metal array layer 30 may be disposed between any two adjacent encapsulation sub-layers. Preferably, in the embodiments of the present invention, the dimming metal array layer 30 may be disposed between the first encapsulation sub-layer 61 and the second encapsulation sub-layer 62. In other words, the dimming metal array layer 30 is disposed on a side of the first encapsulation sub-layer 61 away from the cathode layer 22 and covered by the second encapsulation sub-layer 62, which can make the dimming metal array layer 30 closer to the light-emitting functional layer 20. Therefore, more light can be converted into the elliptically polarized light through the dimming metal array layer 30, so as to increase the amount of light passing through the linear polarizing layer 41 to a greater extent, improving the light extraction efficiency of the display panel.

In other embodiments of the present invention, the dimming metal array layer 30 may also be disposed between the encapsulation layer 60 and the cover plate 70, or between the cover plate 70 and the circular polarizer 40, which is not limited herein.

Further, the dimming metal array layer 30 includes a plurality of nano-metal units 31 arranged at intervals. The plurality of nano-metal units 31 are distributed in an array. The plurality of nano-metal units 31 are configured to convert the passing light into the elliptically polarized light according to a surface plasmon effect. That is, the light irradiates a surface of the nano-metal units 31 and resonates with surface atoms of the nano-metal units 31, thereby regulating polarization of the output light state.

It should be noted that the display panel includes a plurality of pixel units. The anode layer 23 includes a plurality of anodes arranged at intervals. Each of the pixel units includes an anode, the light-emitting layer 21, and the cathode layer 22 covering the anode. Further, in the embodiments of the present invention, the plurality of nano-metal units 31 may be disposed corresponding to one pixel unit, or one nano-metal unit 31 may be disposed corresponding to one pixel unit, or one nano-metal unit 31 may be disposed corresponding to multiple pixel units, which can be set according to actual needs, and there is no limitation here.

Optionally, a material of the nano-metal unit 31 may include gold or silver.

It can be understood that a size of the nano-metal unit 31 is nano-scale, so that the surface plasmon effect can be generated. Optionally, the size of the nano-metal unit 31 may be greater than or equal to 15 nanometers and less than or equal to 100 nanometers. The size of the nano-metal unit 31 may include a length, a width, and a height of the nano-metal unit 31. That is, the length, the width, and the height of the nano-metal unit 31 may be between 15 nm and 100 nm respectively. For example, the length, the width, and the height of the nano-metal unit 31 may be 30 nm, 45 nm, 60 nm, 75 nm, 80 nm, 90 nm, etc.

An area of an orthographic projection of the nano-metal unit 31 on the substrate 10 is ranged between 225 square nanometers and 10,000 square nanometers, and a distance between two adjacent nano-metal units 31 is ranged between 200 nanometers and 300 nm, so that the dimming metal array layer 30 in the embodiments of the present invention can effectively generate the surface plasmon effect.

In the embodiments of the present invention, a shape of the orthographic projection of the nano-metal unit 31 on the substrate 10 includes a convex polygon or a concave polygon. For example, the shape may be a convex polygon such as a square, a rectangle, a triangle, and a rhombus, or a concave polygon formed by combining the above-mentioned shapes.

Figures 3, 4:
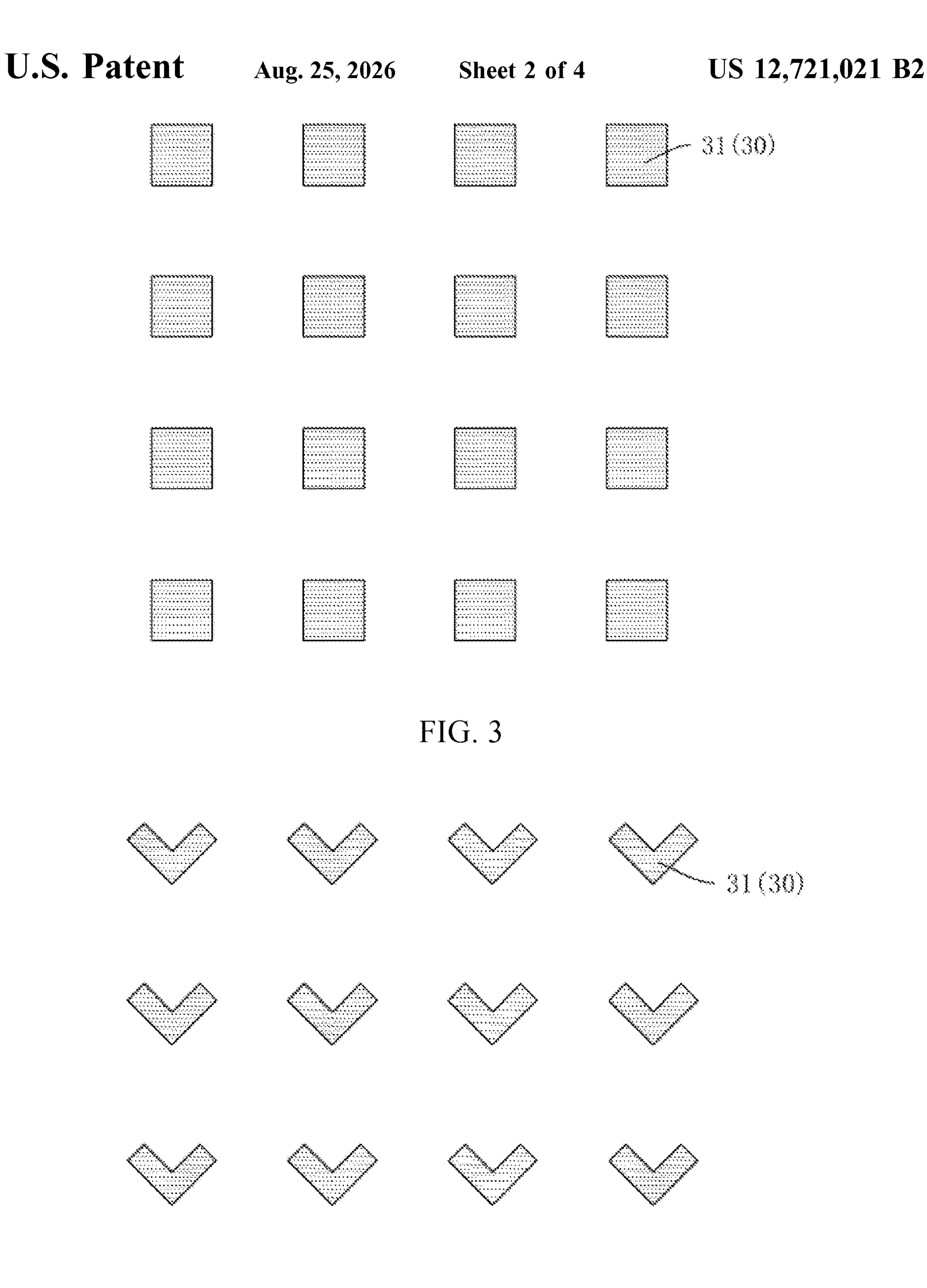
FIG. 3 is a schematic structural diagram of a dimming metal array layer provided by the embodiments of the present invention.
FIG. 4 is another schematic structural diagram of the dimming metal array layer provided by the embodiments of the present invention.

As shown in FIG. 3, the shape of the orthographic projection of the nano-metal unit 31 on the substrate 10 is the square, that is, the convex polygon, and the plurality of nano-metal units 31 are arranged in an array along horizontal and vertical directions. Optionally, as shown in FIG. 4, the shape of the orthographic projection of the nano-metal unit 31 on the substrate 10 is a concave polygon formed by combining two rectangles, and the plurality of nano-metal units 31 are arranged in an array along the horizontal and vertical directions.

In addition, the plurality of nano-metal units 31 may also have different shapes. Optionally, the plurality of nano-metal units 31 are arranged in a multi-circle annular array. The present invention does not limit the shape and arrangement of the nano-metal units 31

Figure 5:
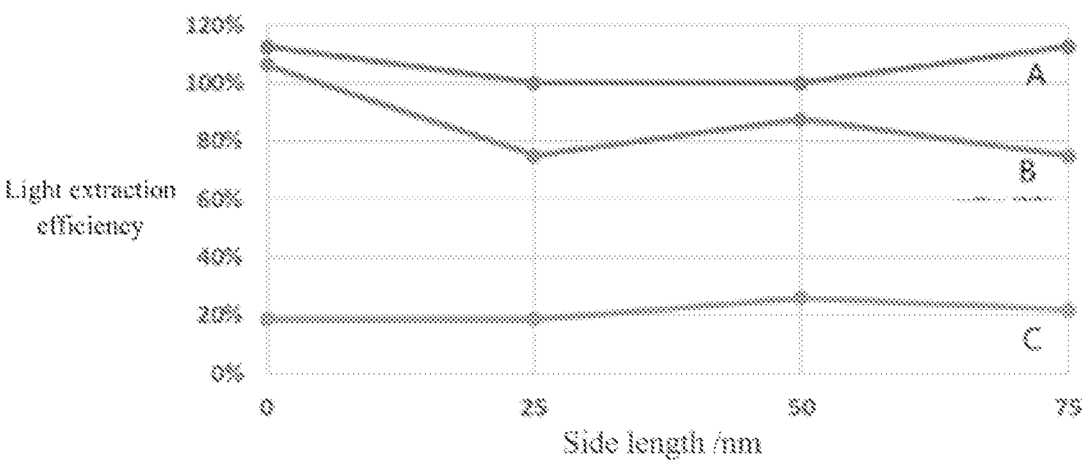
FIG. 5 is a light effect verification curve diagram of the dimming metal array layer provided by the embodiments of the present invention.

In the embodiments of the present invention, an effect of the dimming metal array layer 30 on improving the light extraction efficiency is verified to obtain a curve diagram shown in FIG. 5. The shape of the orthographic projection of the nano-metal unit 31 on the substrate 10 may be the square. An abscissa indicates a distance between two adjacent nano-metal units 31, a vertical axis indicates a percentage increase of the light extraction efficiency, and curve A indicates that a side length of the nano-metal unit 31 is 25 nanometers, curve B indicates that the side length of the nano-metal unit 31 is 50 nanometers, and curve C indicates that the side length of the nano-metal unit 31 is 75 nanometers.

It can be seen from FIG. 5 that when the side length of the nano-metal unit 31 is 75 nanometers, the light extraction efficiency of the display panel can be increased by about 20%. In a case that the side length of the nano-metal unit 31 is 50 nanometers, the light extraction efficiency of the display panel can be increased by 90%. In a case that the side length of the nano-metal unit 31 is 25 nanometers, the light extraction efficiency of the display panel can be increased by about 105%. That is to say, the dimming metal array layer 30 disposed in the embodiments of the present invention can effectively improve the light extraction efficiency of the display panel, and when the side length of the nano-metal unit 31 is less than or equal to 50 nm, the light extraction efficiency of the display panel can be significantly improved.

As mentioned above, the embodiment of the present invention utilizes the dimming metal array layer 30 between the light-emitting functional layer 20 and the linear polarizing layer 41 to convert the passing light into the elliptically polarized light. The included angle between the elliptical long axis direction of the elliptically polarized light and the light transmission axis direction of the linear polarizing layer 41 is less than or equal to 45 degrees. Compared with the circularly polarized light in the prior art, the embodiments of the present invention can increase the light vector of the light reaching the linear polarizing layer 41 along the light transmission axis direction of the linear polarizing layer 41. Therefore, more light can pass through the linear polarizing layer 41, which improves the light extraction intensity and light extraction efficiency of the display panel, thereby reducing the power consumption of the display panel.

In addition, the display panel provided by the embodiments of the present invention may be an OLED display panel, and the cathode layer 22 covers a whole surface of the light-emitting layer 21, which is prone to voltage drop phenomenon, resulting in a brightness of a middle area of the display panel being lower than a brightness of a surrounding area, and then there is a phenomenon of uneven brightness. In the embodiments of the present invention, the brightness uniformity of the display panel can be improved by setting the dimming metal array layer 30 in different regions.

Figure 6:
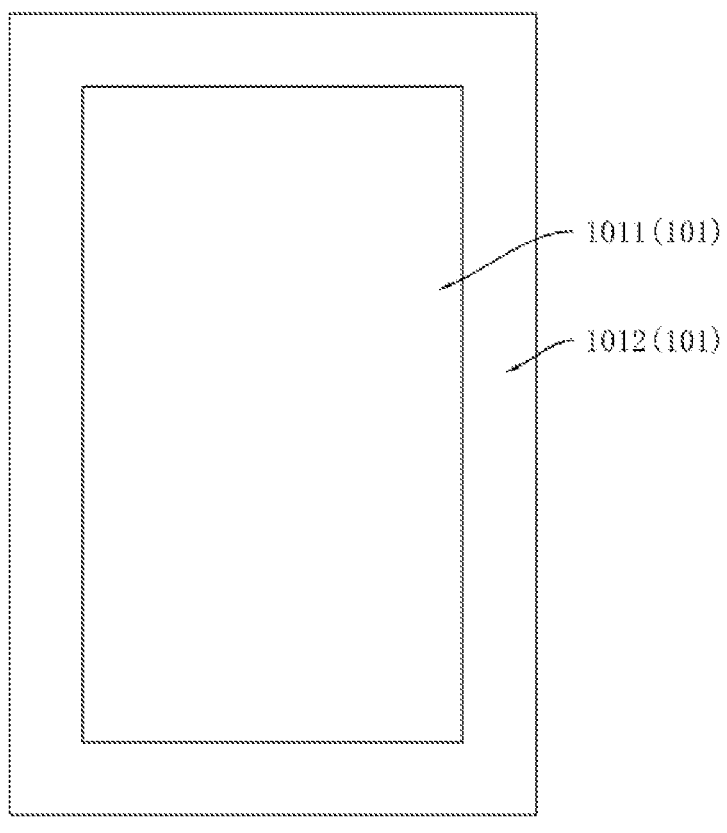
FIG. 6 is a schematic structural diagram of a plane distribution of the display panel provided by the embodiments of the present invention.
Figure 7:
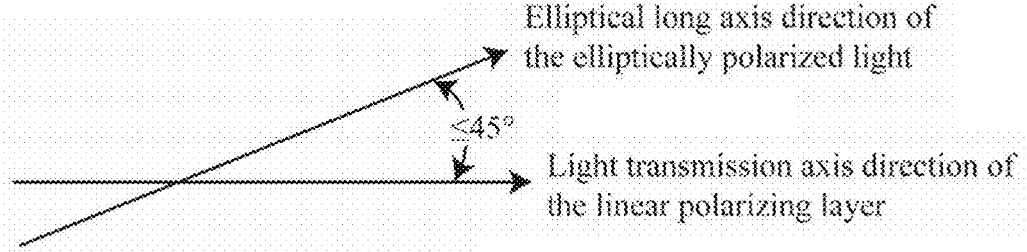
FIG. 7 shows an included angle between an elliptical long axis direction of the elliptically polarized light and a light transmission axis direction of the linear polarizing layer.

Referring to FIG. 2 and FIG. 6, the display panel includes a display area 101. The display area 101 includes a middle display area 1011 and a peripheral display area 1012 arranged around the middle display area 1011.

In the embodiments of the present invention, the dimming metal array layer 30 is disposed in the middle display area 1011, that is, the plurality of nano-metal units 31 are arranged in an array in the middle display area 1011. Furthermore, the display brightness of the middle display area 1011 of the display panel can be increased, so as to improve the display uniformity and display effect of the display panel.

In summary, in the embodiments of the present invention, the dimming metal array layer 30 is added between the light-emitting functional layer 20 and the linear polarizing layer 41. The dimming metal array layer 30 includes the plurality of nano-metal units 31 arranged at intervals. When the light is irradiated on the nano-metal unit 31, the surface plasmon effect can be generated to change the polarization state of the light, so as to convert the passing light into the elliptically polarized light. The included angle between the elliptical long axis direction of the elliptically polarized light and the light transmission axis direction of the linear polarizing layer 41 is less than or equal to 45 degrees. Compared with the circularly polarized light in the prior art, the embodiments of the present invention can increase the light vector of the light reaching the linear polarizing layer 41 along the light transmission axis direction of the linear polarizing layer 41. Therefore, more light can pass through the linear polarizing layer 41, which improves the light extraction intensity and light extraction efficiency of the display panel, thereby reducing the power consumption of the display panel. In addition, in the embodiments of the present invention, the plurality of nano-metal units 31 can be disposed in different regions to improve the brightness uniformity of the display panel, so as to further improve the display effect of the display panel.

In addition, the embodiments of the present invention also provides a display device. The display device includes a device body and the display panel described in the above embodiments. Furthermore, the device body may include a frame, a driving component, a power supply, etc. The display devices may be display terminals such as mobile phones, tablets, and televisions, which are not limited here.

In the foregoing embodiments, the descriptions of each embodiment have their own emphases, and for parts not described in detail in a certain embodiment, reference may be made to relevant descriptions of other embodiments.

The display panel and the display device provided by present invention have been introduced in detail above, and the description of the embodiments is merely intended to help understand the method and core ideas of the present invention. At the same time, for those skilled in the art, based on the idea of the present invention, there will be changes in the specific implementation and application scope. From the above discussion, the contents of this manual should not be understood as limitations on present invention.

What is claimed is:

1. A display panel, comprising:

a substrate;

a light-emitting functional layer, disposed on the substrate;

a dimming metal array layer, disposed on a side of the light-emitting functional layer away from the substrate, and configured to convert light into elliptically polarized light; and a circular polarizer, comprising a linear polarizing layer and a quarter-wave plate disposed on a side of the dimming metal array layer away from the light-emitting functional layer, wherein an included angle between an elliptical long axis direction of the elliptically polarized light and a light transmission axis direction of the linear polarizing layer is less than or equal to 45 degrees.

2. The display panel according to claim 1, wherein the dimming metal array layer comprises a plurality of nano-metal units arranged at intervals.

3. The display panel according to claim 2, wherein a shape of the orthographic projection of each of the nano-metal units on the substrate comprises a convex polygon, and a material of the dimming metal array layer comprises gold or silver.

4. The display panel according to claim 2, wherein the plurality of nano-metal units are arranged in a multi-loop annular array.

5. The display panel according to claim 2, wherein a distance between adjacent two of the nano-metal units is ranged between 200 μm and 300 mm; and an area of an orthographic projection of each of the nano-metal units on the substrate is ranged between 225 square nanometers and 10000 square nanometers.

6. The display panel according to claim 1, further comprising an encapsulation layer disposed between the light-emitting functional layer and the linear polarizing layer, wherein the encapsulation layer comprises a plurality of encapsulation sub-layers arranged in layers, and the dimming metal array layer is disposed between any adjacent two of the encapsulation sub-layers.

7. The display panel according to claim 6, wherein the light-emitting functional layer comprises a light-emitting layer and a cathode layer located on a side of the light-emitting layer away from the substrate; the plurality of encapsulation sub-layers comprise a first encapsulation sub-layer disposed on a side of the cathode layer away from the light-emitting layer and a second encapsulation sub-layer disposed on a side of the first encapsulation sub-layer away from the cathode layer; the dimming metal array layer is disposed on the side of the first encapsulation sub-layer away from the cathode layer; and the second encapsulation sub-layer covers the dimming metal array layer.

8. The display panel according to claim 1, further comprising:

an encapsulation layer, disposed between the light-emitting functional layer and the linear polarizing layer; and a cover plate, disposed on a side of the encapsulation layer away from the substrate;

wherein the dimming metal array layer is disposed between the encapsulation layer and the cover plate, or the dimming metal array layer is disposed between the cover plate and the circular polarizer.

9. The display panel according to claim 1, wherein a light vector component of the elliptically polarized light along the light transmission axis direction of the linear polarizing layer is greater than or equal to 60%.

10. The display panel according to claim 1, wherein the included angle between the elliptical long axis direction of the elliptically polarized light and the light transmission axis direction of the linear polarizing layer is less than or equal to 25 degrees.

11. The display panel according to claim 1, wherein the display panel comprises a display area that comprises a middle display area and a peripheral display area disposed around the middle display area where the dimming metal array layer is disposed.

12. A display device, comprising a display panel, the display panel comprising:

a substrate;

a light-emitting functional layer, disposed on the substrate;

a dimming metal array layer, disposed on a side of the light-emitting functional layer away from the substrate; and a circular polarizer, comprising a linear polarizing layer and a quarter-wave plate disposed on a side of the dimming metal array layer away from the light-emitting functional layer, wherein the dimming metal array layer is configured to convert light passing through the dimming metal array layer into elliptically polarized light, and an included angle between an elliptical long axis direction of the elliptically polarized light and a light transmission axis direction of the linear polarizing layer is less than or equal to 45 degrees.

13. The display device according to claim 12, wherein the dimming metal array layer comprises a plurality of nano-metal units arranged at intervals.

14. The display device according to claim 13, wherein a distance between adjacent two of the nano-metal units is ranged between 200 nm and 300 nm; and an area of an orthographic projection of each of the nano-metal units on the substrate is ranged between 225 square nanometers and 10000 square nanometers.

15. The display device according to claim 12, wherein the display panel further comprises an encapsulation layer disposed between the light-emitting functional layer and the linear polarizing layer, the encapsulation layer comprises a plurality of encapsulation sub-layers arranged in layers, and the dimming metal array layer is disposed between any adjacent two of the encapsulation sub-layers.

16. The display device according to claim 12, wherein a light vector component in a polarization direction of the elliptically polarized light along the light transmission axis of the linear polarizing layer is greater than or equal to 60%.

* * * * *